(12) United States Patent
Huang et al.

(10) Patent No.: US 11,624,763 B2
(45) Date of Patent: Apr. 11, 2023

(54) ERROR-TOLERANT SYSTEM FOR MEASURING IMPEDANCE

(71) Applicant: TRIPLE WIN TECHNOLOGY(SHENZHEN) CO.LTD., Shenzhen (CN)

(72) Inventors: Kang Huang, Shenzhen (CN); Yi-Yin Chen, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 0 days.

(21) Appl. No.: 17/546,372

(22) Filed: Dec. 9, 2021

(65) Prior Publication Data
US 2023/0012533 A1 Jan. 19, 2023

(30) Foreign Application Priority Data
Jul. 16, 2021 (CN) .......................... 202110808938.6

(51) Int. Cl.
*G01R 31/389* (2019.01)
*G01R 27/16* (2006.01)
*G01R 35/00* (2006.01)

(52) U.S. Cl.
CPC .......... *G01R 27/16* (2013.01); *G01R 35/005* (2013.01)

(58) Field of Classification Search
CPC .............................. G01R 27/16; G01R 35/005
See application file for complete search history.

(56) References Cited

U.S. PATENT DOCUMENTS

| 3,904,859 | A | * | 9/1975 | Poncelet | ................ G01R 31/08 |
| | | | | | 702/65 |
| 2010/0176661 | A1 | * | 7/2010 | Wilson | ................ H05B 47/185 |
| | | | | | 307/114 |

* cited by examiner

*Primary Examiner* — Alesa Allgood
(74) *Attorney, Agent, or Firm* — ScienBiziP, P.C.

(57) ABSTRACT

A system for measuring impedance which is tolerant of connection errors includes a measuring instrument and a relay plate. The relay plate includes a plurality of relay groups. A relay group comprises a first channel, a second channel, a third channel, and a fourth channel. The first to fourth channels are electrically connected to a conductive pin of the product. The relay board further comprises a first voltage interface, a second voltage interface, a first current interface, and a second current interface, the first voltage interface is electrically connected to the first channel, the first current interface is electrically connected to the second channel, the second voltage interface is electrically connected to the third channel, and the second current interface is electrically connected to the fourth channel, a control unit being able to switch between these when connected to obtain impedance measurements.

17 Claims, 4 Drawing Sheets

| Positive electrode \ Negative pole | First conductive pin | Second conductive pin | Third conductive pin | ... | Nth conductive pin |
|---|---|---|---|---|---|
| First conductive pin | / | | | | |
| Second conductive pin | | / | | | |
| Third conductive pin | ... | | / | ... | |
| ... | | ... | ... | / | ... |
| Nth conductive pin | | | | ... | / |

FIG. 4

ERROR-TOLERANT SYSTEM FOR MEASURING IMPEDANCE

TECHNICAL FIELD

The present disclosure relates to impedance measurement system.

BACKGROUND

In the process of electrical anomaly detection in products, open-circuit and short-circuit test is usually carried out to verify whether a measured pin (PIN) is short-circuited with other pins. The common practice of open-circuit and short-circuit test is to use a handheld multimeter to measure the impedance between all pins of the product.

When the product has multiple pins, the number of measures is more, resulting in low efficiency, and it is easy to connect incorrectly, resulting in measurement errors.

Therefore, improvement is desired.

BRIEF DESCRIPTION OF THE DRAWINGS

FIG. 4 is a schematic diagram of impedance table record in an embodiment of the present disclosure.

DETAILED DESCRIPTION

The technical solutions in the embodiments of the present disclosure will be described in conjunction with the accompanying drawings in the embodiments of the present disclosure. Obviously, the described embodiments are part of the embodiments of the present disclosure, not all of them. Based on the embodiments of the present disclosure, all other embodiments obtained by those of ordinary skill in the art without creative work shall fall within the protection scope of the present disclosure.

In the description of the present disclosure, it should be noted that, unless otherwise clearly specified and limited, the terms "install", "connect" and "connection" should be understood in a broad sense, for example, it can be fixed connection, removable connection, or integrated connection. It can be mechanical connection, electrical connection or mutual communication. It can be directly connected or indirectly connected through an intermediate medium. It can be the connection within two elements or the interaction relationship between two elements.

The following disclosure provides many different embodiments or examples to implement different structures of the present application. In order to simplify the disclosure of the present application, the components and settings of specific examples are described below. Of course, they are merely examples and are not intended to limit the present application. In addition, the present application may repeat reference numbers and reference letters in different examples for the purpose of simplification and clarity, which itself does not indicate the relationship between the various embodiments and settings discussed.

Figure 1:
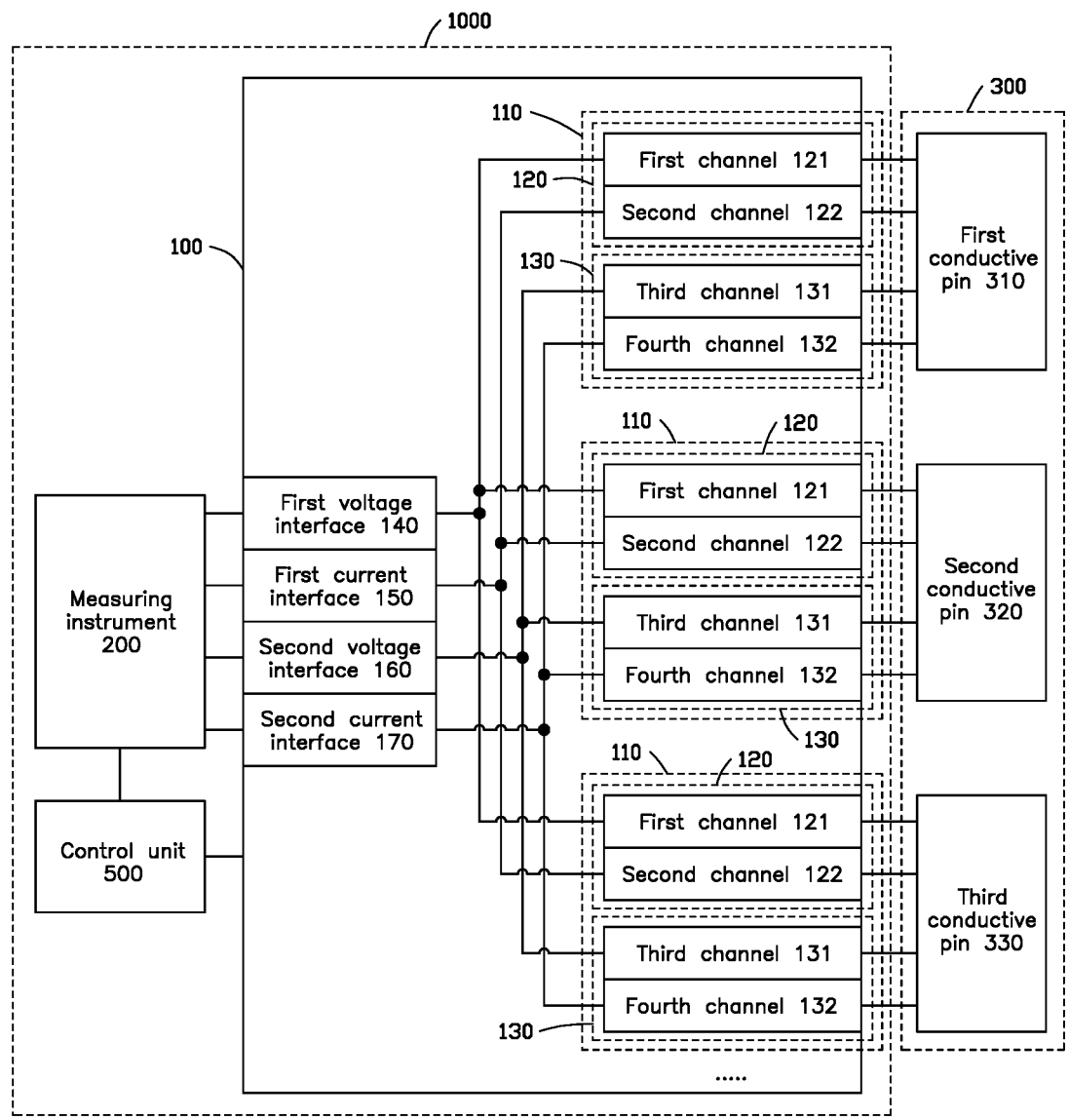
FIG. 1 is a schematic diagram of an impedance measurement system according to an embodiment of the present disclosure.

FIG. 1 illustrates an impedance measurement system 1000 in accordance with an embodiment of the present disclosure.

The impedance measurement system 1000 is used to measure the impedance between the conductive pins of a product 300. The impedance measurement system 1000 includes a relay plate 100 and a measuring instrument 200.

The relay plate 100 includes a plurality of relay groups 110. Each relay group 110 includes a first channel 121, a second channel 122, a third channel 131, and a fourth channel 132. The relay plate 100 further includes a first voltage interface 140, a second voltage interface 160, a first current interface 150, and a second current interface 170. The first voltage interface 140 and the first current interface 150 are positive interfaces, and the second voltage interface 160 and the second current interface 170 are negative interfaces.

The first voltage interface 140 is electrically connected to the first channel 121. The first current interface 150 is electrically connected to the second channel 122. The second voltage interface second voltage interface 160 is electrically connected to the third channel 131. The second current interface 170 is electrically connected to the fourth channel 132.

The measuring instrument 200 is used for measuring impedance. All of the first voltage interface 140, the second voltage interface 160, the first current interface 150, and the second current interface 170 are electrically connected to the measuring instrument 200. The measuring instrument 200 can measure resistance, capacitance, and inductance at least. The measuring instrument 200 may be an impedance analyzer.

In the embodiment, taking three conductive pins of the product 300 as an example, the working principle of the impedance measurement system 1000 is described in detail. For example, the product 300 includes a first conductive pin 310, a second conductive pin 320, and a third conductive pin 330. During actual measurement, the number of the relay groups 110 should be greater than or equal to the total number of conductive pins of the product 300.

During the test, the first conductive pin 310, the second conductive pin 320 and the third conductive pin 330 are each electrically connected to one relay group 110, such as the first channel 121, the second channel 122, the third channel 131, and the fourth channel 132 electrically connected to the relay group 110.

It can be understood that by setting the relay group 110 with multiple channels and electrically connecting each relay group 110 with one conductive pin of the product 300, the connection of a conductive pin to the circuit of impedance measurement can be independently controlled by opening and closing the channel of each relay group 110. Therefore, repeated switching wiring between different conductive pins of the product 300 is avoided, the measurement efficiency is improved and the possibility of measurement error is reduced.

Each relay group 110 includes a first relay 120 and a second relay 130. The first channel 121 and the second channel 122 constitute the first relay 120, and the third channel 131 and the fourth channel 132 constitute the second relay 130.

In one embodiment, the impedance measurement system 1000 further includes a control unit 500, and the control unit 500 is used for controlling the relay plate 100 to switch channels. A first end of the control unit 500 is electrically connected to the relay plate 100, and the second end of the control unit 500 is electrically connected to the measuring instrument 200. The control unit 500 may be a computer or an industrial computer having the above control functions. During each switching, the control unit 500 opens only the channels of the two relay groups 110 electrically connected to the two conductive pins to be tested, and closes the channels of the other relay group 110, and only the first relay 120 of one of the relay group 110 and the second relay 130 of the other relay groups 110 are opened during each measurement.

Through the switching of the control unit 500, only the channels of the two relay group 110 electrically connected to the two conductive pins to be tested are opened each time, and the channels of the other relay groups 110 are closed. Two different conductive pins can be connected to the impedance measurement loop at one time according to the measurement needs. The impedance between all conductive pins can be measured by multiple switching.

When the impedance measurement is performed between the first conductive pin 310 and the second conductive pin 320, the control unit 500 switches the channel twice. During the first switching, the control unit 500 turns on the first relay 120 of the relay group 110 electrically connected to the first conductive pin 310, turns on the second relay 130 of the relay group 110 electrically connected to the second conductive pin 320, turns off the second relay 130 electrically connected to the first conductive pin 310, and turns off the first relay 120 electrically connected to the second conductive pin 320. Thus, the first voltage interface 140, the first channel 121 electrically connected to the pin first conductive pin 310, the first conductive pin 310, the second conductive pin 320, the third channel 131 electrically connected to the second conductive pin 320 and the second voltage interface 160 form a first loop, to measure the voltage between the first conductive pin 310 and the second conductive pin 320. The first current interface 150, the second channel 122 electrically connected to the first conductive pin 310, the first conductive pin 310, the second conductive pin 320, the fourth channel 132 electrically connected to the second conductive pin 320, and the second current interface 170 form a second loop, to supply a test current between the first conductive pin 310 and the second conductive pin 320. The test current is provided by the measuring instrument 200. Thus, the impedance between the first conductive pin 310 and the second conductive pin 320 can be measured according to the voltage in the first loop and the test current (the measured voltage is divided by the test current).

During the second switching, the control unit 500 turns on the second relay 130 electrically connected to the first conductive pin 310, turns on the first relay 120 electrically connected to the second conductive pin 320, turns off the first relay 120 electrically connected to the first conductive pin 310, and turns off the second relay 130 electrically connected to the second conductive pin 320. Thus, the first voltage interface 140, the first channel 121 electrically connected to the second conductive pin 320, the second conductive pin 320, the first conductive pin 310, the third channel 131 electrically connected to the first conductive pin 310, and the second voltage interface 160 form a first loop, measuring the voltage between the first conductive pin 310 and the second conductive pin 320. The first current interface 150, the second channel 122 electrically connected to the second conductive pin 320, the second conductive pin 320, the first conductive pin 310, the fourth channel 132 electrically connected to the second conductive pin 320, and the second current interface 170 form a second loop, to supply test current between the first conductive pin 310 and the second conductive pin 320. The test current is provided by the measuring instrument 200. Thus, the impedance between the second conductive pin 320 and the first conductive pin 310 can be calculated according to the voltage in the first loop and the test current (the measured voltage is divided by the test current).

It can be understood that there is no strict sequence between the first connection method (circuit connection method of the first switching) and the second connection method (circuit connection method of the second switching). In another embodiment, the sequence of the two connection methods can be adjusted.

When the impedance is measured between the first conductive pin 310 and the third conductive pin 330, the control unit 500 still switches the channel twice. The specific process is similar to the impedance measurement between the first conductive pin 310 and the third conductive pin 330, which will not be repeated here.

If devices such as diodes, triodes, and MOS transistors are included between the two conductive pins, measuring the impedance twice is necessary because these devices have conductivity in one direction only, as shown in the first switching and the second switching above. The measured impedance values of the two circuit connections are different, so it is necessary to measure the impedance twice. For example, when measuring the first conductive pin 310 and the second conductive pin 320, the positive pole of the measuring instrument 200 is connected to the first conductive pin 310 and the negative pole is connected to the second conductive pin 320 for the first connection. The positive pole of the measuring instrument 200 is connected to the second conductive pin 320 and the negative pole connected to the first conductive pin 310 for the second connection.

It is understandable that the order of two connections can also be exchanged. Since the first relay 120 of the relay group 110 is electrically connected to the positive electrode (for example, the first voltage interface 140 and the first current interface 150), the second relay 130 of the relay group 110 is electrically connected to the negative electrode (for example, the second voltage interface 160 and the second current interface 170). Thus, the control unit 500 turning on and turning off the first relay 120 and the second relay 130 allows the impedance between each two conductive pins to be measured twice, with reversed positive and negative connections.

If devices such as diodes, triodes, and MOS transistors are not included between the two conductive pins, the impedance values measured by the first switching and the second switching are constant.

Figure 2:
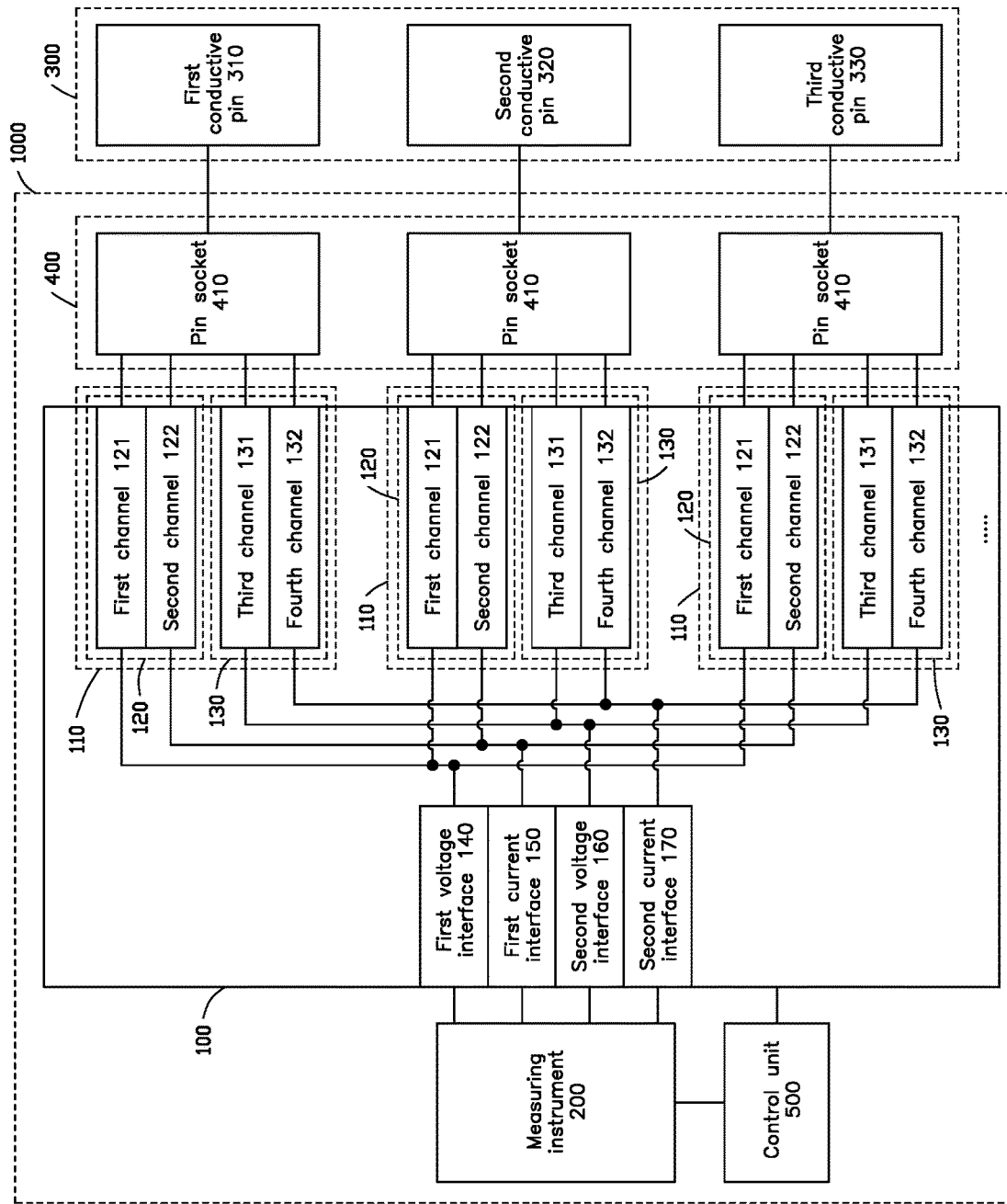
FIG. 2 is a schematic diagram of an adapting plate in the system according to an embodiment of the present disclosure.

FIG. 2 illustrates the impedance measurement system 1000 in accordance with another embodiment of the present disclosure.

In the embodiment, the impedance measurement system 1000 further includes an adapting plate 400, the adapting plate 400 is electrically connected between the relay plate 100 and the product 300. The adapting plate 400 includes a plurality of pin sockets 410. The number of the pin sockets 410 is greater than or equal to the number of conductive pins of the product 300. For example, in the embodiment, the adapting plate 400 includes three pin sockets 410 for respectively receiving the first conductive pin 310, the second conductive pin 320, and the third conductive pin 330 of the product 300. Each of the pin sockets 410 is electrically connected to one relay group 110, such as the first channel 121, the second channel 122, the third channel 131, and the fourth channel 132 electrically connected to the relay group 110.

It can be understood that since each conductive pin of the product needs to be connected to the first channel 121, the second channel 122, the third channel 131, and the fourth channel 132 at the same time during measurement, the configuration of the adapting plate 400 means that each conductive pin only needs to be electrically connected to one pin socket 410 during measurement, this facilitates simple wiring.

In the present embodiment, the number of conductive pins is n, and N is a positive integer greater than or equal to 2. The control unit 500 performs n×(n−1) channel switching times, and obtains n×(n−1) impedance data after measurement and recording.

Figure 3:
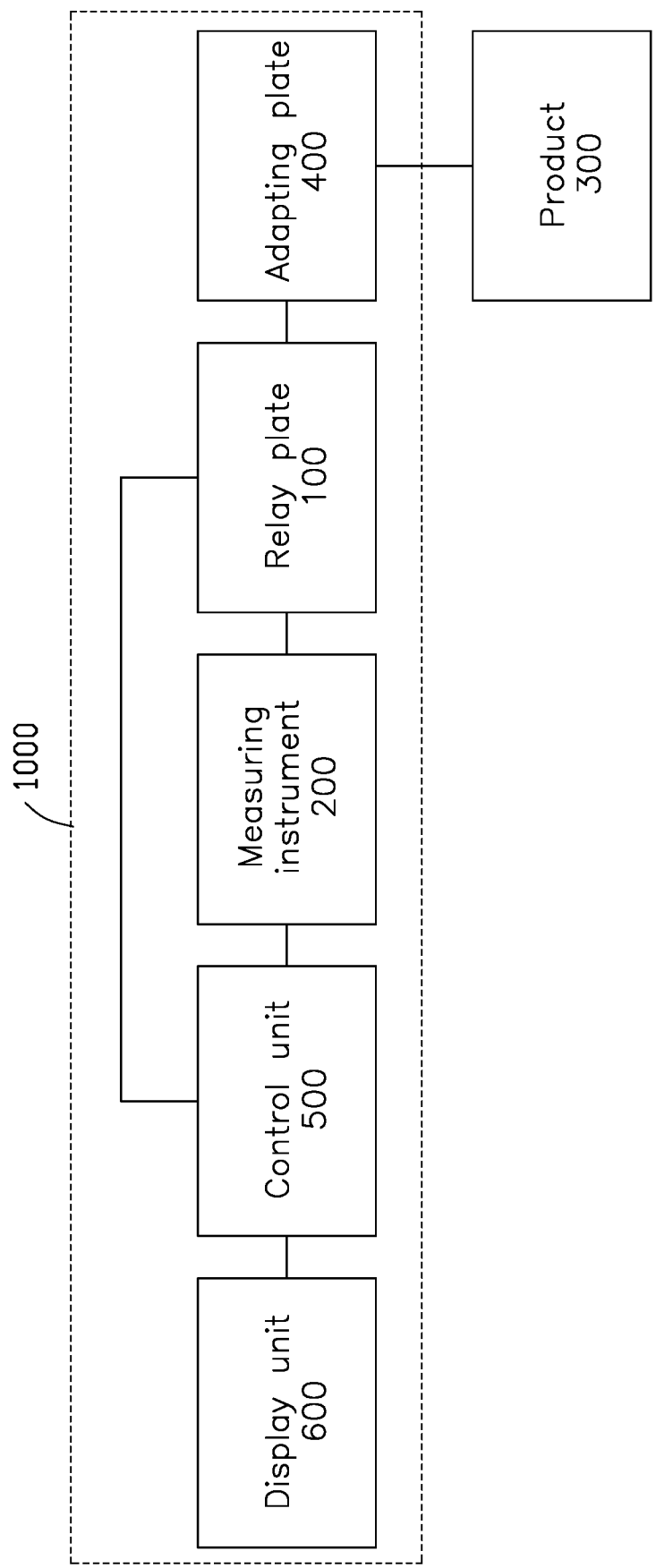
FIG. 3 is a schematic diagram of the impedance measurement system according to another embodiment of the present disclosure.

Referring to FIG. 3, the impedance measurement system 1000 further includes a display unit 600 for displaying the measured impedance data. The display unit 600 is electrically connected to the control unit 500.

FIG. 4 is a schematic diagram of impedance data measured by the impedance measurement system 1000. The impedance data may be displayed on the display unit 600. As shown in FIG. 4, the horizontal axis shows the conductive pin connected to the positive electrode, which is, for example, the first voltage interface 140 and the first current interface 150. The vertical axis shows the conductive pin connected to the negative electrode, for example, the second voltage interface 160 and the second current interface 170. Since the relay plate 100 measures the impedance between the two conductive pins, it is not necessary to connect the positive and negative electrodes to the same conductive pin, so the data on the diagonal in FIG. 4 is the default. Through the display unit 600, the display of impedance data is realized.

In one embodiment, the impedance measurement system 1000 further includes a fixing mechanism (not shown), and the fixing mechanism is used for fixing the relay plate 100 and the adapting plate 400, so that the relay plate 100 is always fixed and stable during the impedance measurement process, so as to avoid measurement errors caused by unstable or uncertain contact.

Those of ordinary skill in the art should realize that the above embodiments are only used to illustrate the present disclosure, but not to limit the present disclosure. As long as they are within the essential spirit of the present disclosure, the above embodiments are appropriately made. Changes and changes fall within the scope of protection of the present disclosure.

What is claimed is:

1. An impedance measurement system configured for measuring impedance between conductive pins of a product, and comprising:
   a measuring instrument; and
   a relay plate comprising a plurality of relay groups; wherein each of the plurality of relay groups comprises a first channel, a second channel, a third channel and a fourth channel; the first channel, the second channel, the third channel and the fourth channel are electrically connected to a conductive pin of the product;
   wherein the relay board further comprises a first voltage interface, a second voltage interface, a first current interface and a second current interface, the first voltage interface is electrically connected to the first channel, the first current interface is electrically connected to the second channel, the second voltage interface is electrically connected to the third channel, and the second current interface is electrically connected to the fourth channel; and
   wherein the measuring instrument is electrically connected to the first voltage interface, the second voltage interface, the first current interface and the second current interface.

2. The impedance measurement system of claim 1, wherein:
   the impedance measurement system further comprises an adapting plate, the adapting plate is electrically connected between the relay plate and the product, the adapting plate comprises a plurality of pin sockets, each pin socket is configured to receive one conductive pin of the product, and each pin socket is also electrically connected to the first channel, the second channel, the third channel and the fourth channel.

3. The impedance measurement system of claim 1, wherein:
   the measuring instrument is an impedance analyzer.

4. The impedance measurement system of claim 1, wherein:
   the control unit is a computer.

5. The impedance measurement system of claim 1, wherein:
   each of the plurality of relay groups comprises a first relay and a second relay, the first channel and the second channel constitute the first relay, and the third channel and the fourth channel constitute the second relay.

6. The impedance measurement system of claim 5, wherein:
   the impedance measurement system further comprises a control unit, the control unit is configured to turn on or turn off the first channel, the second channel, the third channel and the fourth channel of the relay group, and the control unit turns on the first relay of one relay group and the second relay of another relay group, and turns off the other first relays and the second relays at one time.

7. The impedance measurement system of claim 5, wherein:
   during impedance measurement between a first conductive pin of the product and a second conductive pin of the product, the control unit switches two channels, during a first switching, the control unit turns on the first relay electrically connected to the first conductive pin, turns on the second relay electrically connected to the second conductive pin, turns off the second relay electrically connected to the first conductive pin, turns off the first relay electrically connected to the second conductive pin, and turns on the second relay electrically connected to the first conductive pin; wherein during a second switching, the control unit turns on the second relay electrically connected to the first conductive pin, turns on the first relay electrically connected to the second conductive pin, and turns off the first relay electrically connected to the first conductive pin and the second relay electrically connected to the second conductive pin.

8. The impedance measurement system of claim 7, wherein:
   the control unit is configured for n×(n−1) secondary channel switching to obtain n×(n−1) impedance data, wherein n is a number of conductive pins of a product, and n a positive integer greater than or equal to 2.

9. The impedance measurement system of claim 8, wherein:
   the impedance measurement system further comprises a display unit, and the display unit is configured for displaying measured impedance data.

10. A impedance measurement system configured for measuring impedance between conductive pins of a product, and comprising:
- a measuring instrument; and
- a relay plate comprising a plurality of relay groups; wherein each of the plurality of relay groups comprises a first channel, a second channel, a third channel and a fourth channel; the first channel, the second channel, the third channel and the fourth channel are electrically connected to a conductive pin of the product;
- wherein the relay board further comprises a first voltage interface, a second voltage interface, a first current interface and a second current interface, the first voltage interface is electrically connected to the first channel, the first current interface is electrically connected to the second channel, the second voltage interface is electrically connected to the third channel, and the second current interface is electrically connected to the fourth channel; and
- wherein the measuring instrument is electrically connected to the first voltage interface, the second voltage interface, the first current interface and the second current interface;
- wherein the impedance measurement system further comprises an adapting plate, the adapting plate is electrically connected between the relay plate and the product, the adapting plate comprises a plurality of pin sockets, each pin socket is configured to receive one conductive pin of the product, and each pin socket is also electrically connected to the first channel, the second channel, the third channel and the fourth channel.

11. The impedance measurement system of claim 10, wherein:
the impedance measurement system further comprises a display unit, and the display unit is configured for displaying measured impedance data.

12. The impedance measurement system of claim 10, wherein:
the measuring instrument is an impedance analyzer.

13. The impedance measurement system of claim 10, wherein:
the control unit is a computer.

14. The impedance measurement system of claim 10, wherein:
each of the plurality of relay groups comprises a first relay and a second relay, the first channel and the second channel constitute the first relay, and the third channel and the fourth channel constitute the second relay.

15. The impedance measurement system of claim 14, wherein:
the impedance measurement system further comprises a control unit, the control unit is configured to turn on or turn off the first channel, the second channel, the third channel and the fourth channel of the relay group, and the control unit turns on the first relay of one relay group and the second relay of another relay group, and turns off the other first relays and the second relays at one time.

16. The impedance measurement system of claim 14, wherein:
during impedance measurement between a first conductive pin of the product and a second conductive pin of the product, the control unit switches two channels, during a first switching, the control unit turns on the first relay electrically connected to the first conductive pin, turns on the second relay electrically connected to the second conductive pin, turns off the second relay electrically connected to the first conductive pin, turns off the first relay electrically connected to the second conductive pin, and turns on the second relay electrically connected to the first conductive pin; wherein during a second switching, the control unit turns on the second relay electrically connected to the first conductive pin, turns on the first relay electrically connected to the second conductive pin, and turns off the first relay electrically connected to the first conductive pin and the second relay electrically connected to the second conductive pin.

17. The impedance measurement system of claim 14, wherein:
the control unit is configured for n×(n−1) secondary channel switching to obtain n×(n−1) impedance data, wherein n is a number of conductive pins of a product, and n a positive integer greater than or equal to 2.

* * * * *